(12) United States Patent
Chan et al.

(10) Patent No.: US 7,560,650 B2
(45) Date of Patent: Jul. 14, 2009

(54) SUBSTRATE STRUCTURE AND METHOD FOR MANUFACTURING THE SAME

(75) Inventors: Shu-Luan Chan, Zhongli (TW); Chi-Chih Huang, Taipei (TW); Shuo-Hsun Chang, Zhongli (TW)

(73) Assignee: Advanced Semiconductor Enginieering Inc., Kaohsiung (TW)

( * ) Notice: Subject to any disclaimer, the term of this patent is extended or adjusted under 35 U.S.C. 154(b) by 0 days.

(21) Appl. No.: 11/614,187

(22) Filed: Dec. 21, 2006

(65) Prior Publication Data
US 2007/0295531 A1    Dec. 27, 2007

(30) Foreign Application Priority Data
Jun. 21, 2006    (TW) .............. 95122360 A

(51) Int. Cl.
*H05K 1/03*    (2006.01)
(52) U.S. Cl. ............................. 174/255
(58) Field of Classification Search ............ 174/255; 257/698, 734
See application file for complete search history.

(56) References Cited

U.S. PATENT DOCUMENTS

| | | | |
|---|---|---|---|
| 5,639,695 A | | 6/1997 | Jones et al. |
| 6,022,761 A | | 2/2000 | Grupen-Shemansky et al. |
| 6,249,052 B1 * | | 6/2001 | Lin ............... 257/737 |
| 6,432,748 B1 | | 8/2002 | Hsu |
| 6,489,572 B2 | | 12/2002 | Ho et al. |
| 6,573,595 B1 * | | 6/2003 | Chen et al. ............... 257/698 |
| 2003/0215566 A1 * | | 11/2003 | Kung et al. ............... 427/96 |
| 2004/0223309 A1 * | | 11/2004 | Haemer et al. ............... 361/767 |
| 2007/0216019 A1 * | | 9/2007 | Hsu ............... 257/700 |

FOREIGN PATENT DOCUMENTS

| | | |
|---|---|---|
| TW | 591765 | 6/2004 |
| TW | 1230027 | 3/2005 |
| TW | 1237885 | 8/2005 |
| TW | 1244183 | 11/2005 |

OTHER PUBLICATIONS

English language translation of abstract of TW 591765.
English language translation of abstract of TW 1244183.
English language translation of abstract of TW 1237885.
English language translation of abstract of TW 1230027.

* cited by examiner

*Primary Examiner*—Dean A. Reichard
*Assistant Examiner*—Abiy Getachew
(74) *Attorney, Agent, or Firm*—Thomas, Kayden, Horstemeyer & Risley

(57) ABSTRACT

A substrate structure is disclosed. The substrate structure includes a core substrate, an interconnection portion and a solder mask; herein the core substrate includes a top surface and a bottom surface opposite the top surface. A circuit pattern is disposed on the top surface. The interconnection portion is disposed on the top surface; herein the interconnection portion includes a surface dielectric layer and a surface circuit layer disposed thereon. The surface circuit layer is electrically connected to the circuit pattern, and the surface dielectric layer includes at least a hole that is not covered with the surface circuit layer. The solder mask is disposed on the interconnection portion; herein the solder mask includes an indentation disposed above the hole. In addition, a method for manufacturing the substrate structure is disclosed.

15 Claims, 20 Drawing Sheets

270a

SUBSTRATE STRUCTURE AND METHOD FOR MANUFACTURING THE SAME

RELATED APPLICATIONS

The present application is based on, and claims priority from, Taiwan Application Serial Number 95122360, filed Jun. 21, 2006, the disclosure of which is hereby incorporated by reference herein in its entirety.

FIELD OF THE INVENTION

This invention relates generally to a substrate structure and a method for manufacturing the same, and more particularly, to a substrate structure both having an identification mark and a method for manufacturing the same.

BACKGROUND OF THE INVENTION

Nowadays, since the need for information is increasing, for accordance with ever-increasing demands for higher operating speeds, versatility, integration and lightweight miniaturization etc. of electronic devices, the process technology also tends to develop semiconductor with miniaturization and high density. In order to reduce the packaging volume, as well as to increase the function of the packaging devices, several advanced packaging technologies, for example, flip-chip package, ball-grid array (BGA) package and chip-scale package (CSP) etc., are widely applied in the industry. As the substrate type carrier has advantages of fine wirings, compact package and well performance etc., it is widely applied in the aforementioned advanced package technology.

Reference is made to FIG. 1, which depicts a top view of a prior substrate strip. The substrate strip 100 is, for example, a multilayer board, which comprises a plurality of substrate units 110 and a frame 120 surrounding the substrate units 110. Each substrate unit 110 is defined as a packaging area, which is assembled with a chip (not shown) together during a packaging process, so as to form a packaging structure (not shown). Comparatively, the frame 120 is defined as a non-packaging area, and supports 130 are employed to fix and support the substrate units 110. After completing the packaging process, a separating process may be performed by cutting the supports 130, for separating the substrate 110 from the frame 120, so as to form a plurality of separate packaging structures (not shown). Typically, the frame 120 of the packaging substrate 100 has an identification mark 140 disposed thereon, for identifying the lot number and related process information of the packaging substrate strip 100. Consequently, when there are some qualitative problems occurred in the packaging substrate strip 100, the identification mark 140 can be available to trace all history information of the packaging substrate strip 100 during the process, so as to clarify the reason why the problems occurred and to provide trouble shooting. However, once the packaging substrate strip 100 is assembled with the chip together and the packaging process is completed, the separating process will be formed to separate the substrate unit 110 from the frame 120. At this time, if there are some qualitative problems occur in the separate packaging structures, it will be very difficult to find out which lot number of the packaging substrate strip 100 is used in the separate packaging structures. This results in more difficulties in monitoring process and trouble shooting, as well as less product yield.

SUMMARY OF THE INVENTION

Consequently, there is a need for improving the packaging substrate structure, in order to overcome the problems of hardly monitoring process changes and trouble shooting in the prior process, so as to achieve the purpose that the product quality and process yield are both increased.

It is an aspect of the present invention to provide a substrate structure, which has an identification mark directly fabricated on a substrate unit of the substrate strip to identify each substrate unit, so that it overcomes the prior problems of more difficulties in monitoring process and trouble shooting due to unfavorable quality of the substrate unit in the package structure after completing the packaging process.

It is another aspect of the present invention to provide a method for manufacturing a substrate structure, which has at least one hole that is designed to be formed on a surface dielectric layer thereof but not covered with a surface circuit layer thereof for forming an indentation on a solder mask thereof, so as to fabricate the substrate structure with an identification mark.

According to the aforementioned aspects of the present invention, a substrate structure is provided, which comprises a core substrate, an interconnection portion and a solder mask. The core substrate includes a top surface and a bottom surface opposite the top surface. A circuit pattern is disposed on the top surface. The interconnection portion, which is disposed on the top surface, comprises a surface dielectric layer and a surface circuit layer disposed thereon. The surface circuit layer is electrically connected to the circuit pattern, and the surface dielectric layer has at least one hole disposed thereon but not covered with the surface circuit layer. The solder mask, which is disposed on the interconnection portion, has an indentation above the hole.

According to another aspect of the present invention, a method for manufacturing a substrate structure is provided and comprises the following steps. A core substrate is provided, which includes a top surface and a bottom surface opposite the top surface and a circuit pattern is disposed on the top surface. Next, an interconnection portion is formed on the top surface by forming a surface dielectric layer on the circuit pattern and forming a surface circuit layer on the surface dielectric layer, in which the surface circuit layer is electrically connected to the circuit pattern, and the surface dielectric layer has at least one hole disposed thereon but not covered with the surface circuit layer. And then, the solder mask is formed on the interconnection portion, in which the solder mask has an indentation disposed above the hole.

In a preferred embodiment of the present invention, the aforementioned hole may be, for example, numeral-, character-, or drawing-shaped.

With the application of the aforementioned substrate structure, as an identification mark is directly fabricated on the substrate unit to ensure that the lot numbers of the substrate unit in the packaging structure can be still identified while the packaging process is completed, so as to overcome the prior problems of more difficulties in monitoring process and trouble shooting in the package structure, as well as the problem of the decreased yield. Additionally, the present method for manufacturing the substrate structure is to design at least one hole that is not covered with the surface circuit layer, to form an indentation as an identification mark on the solder mask, for identifying the substrate unit. Therefore, in comparison with the conventional structure and the manufacturing method thereof, the substrate structure disclosed by the present invention is not only capable of overcoming the prior problems of more difficulties in trouble shooting in the package structure and the problem of the decreased yield, but also substantially reducing the fabricating time and cost. Besides, the present method for manufacturing the substrate structure can be employed to fabricate the substrate structure having an identification mark, instead of changing the existing prior process flow.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
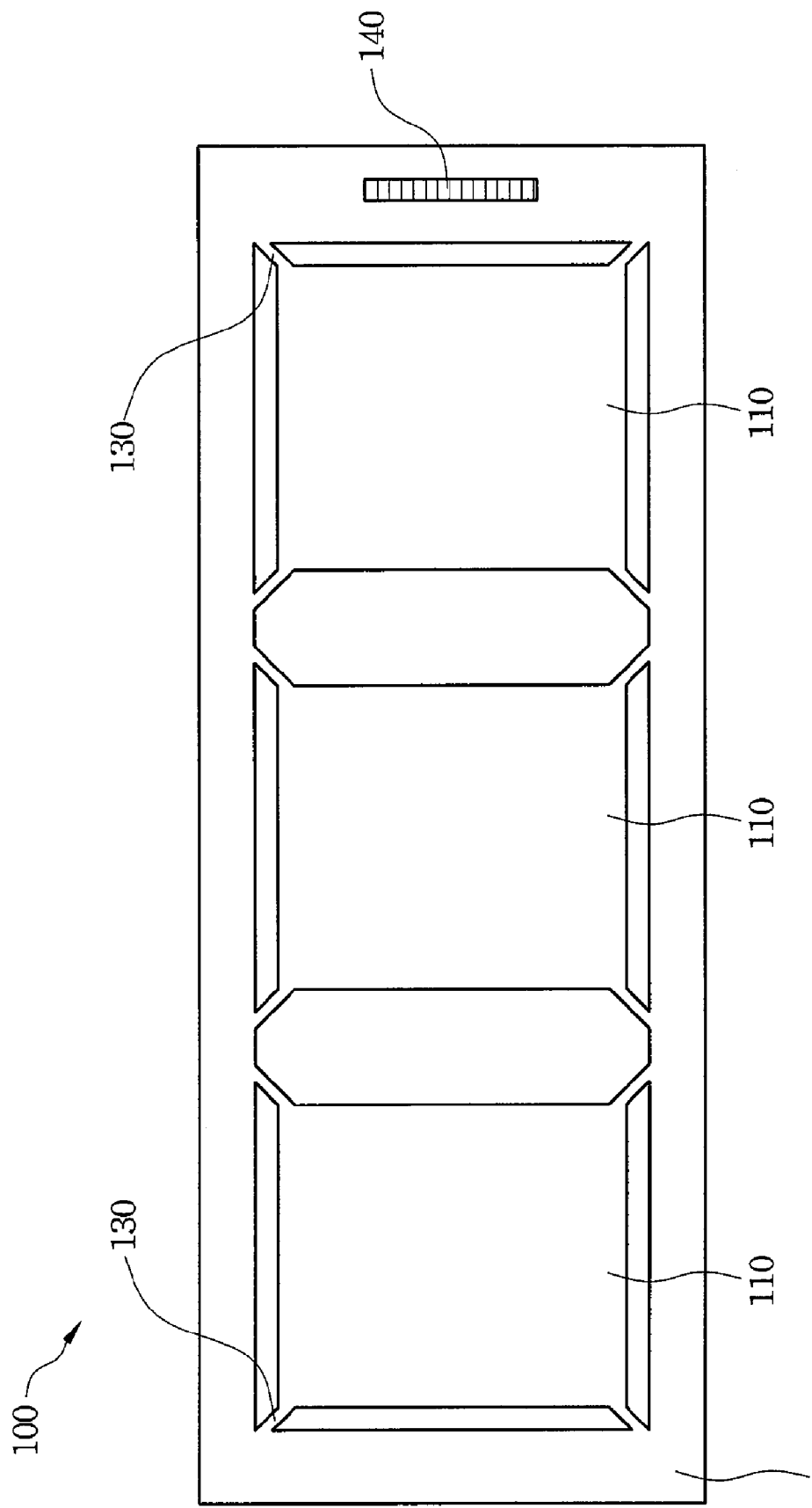
FIG. 1 is a top view of a prior substrate strip.
Figure 2A:
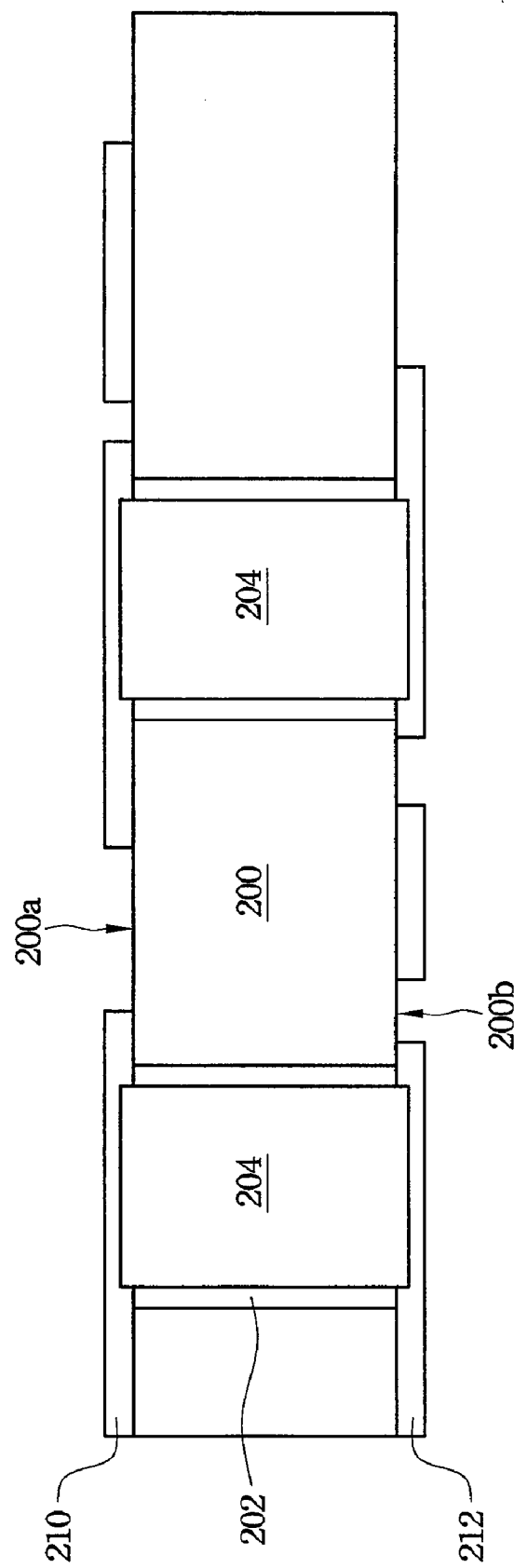
FIGS. 2A to 2I are cross-sectional diagrams of the process flow of a substrate structure according to one preferred embodiment of the present invention.
Figure 2B:
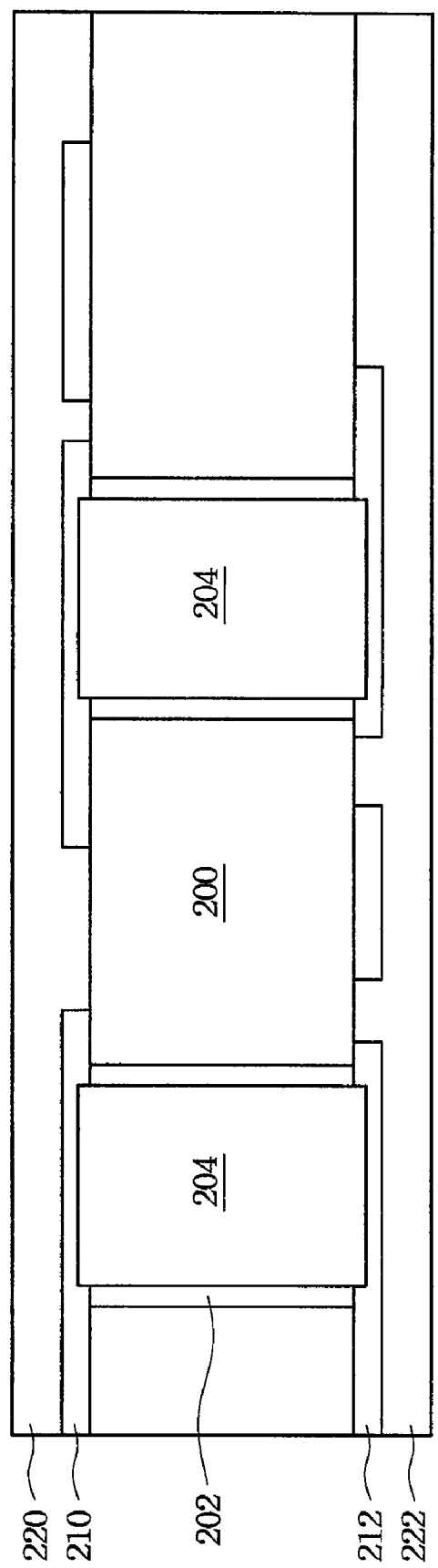
Figure 2C:
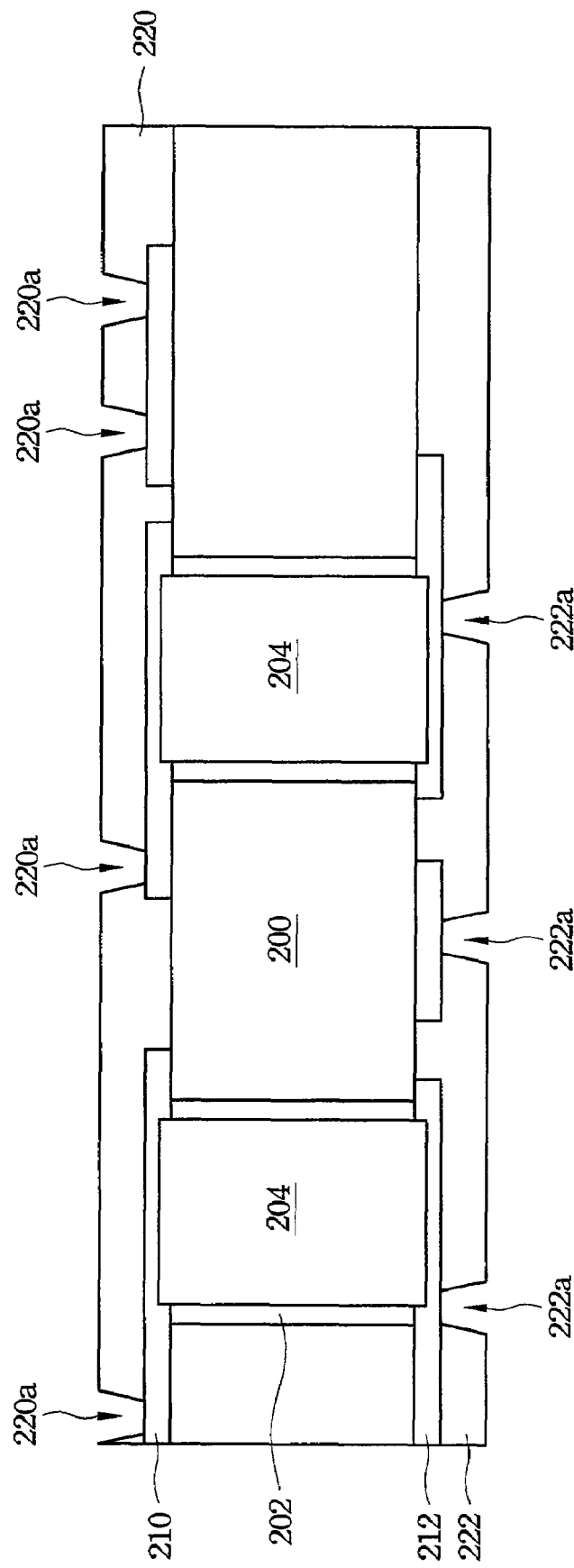
Figure 2D:
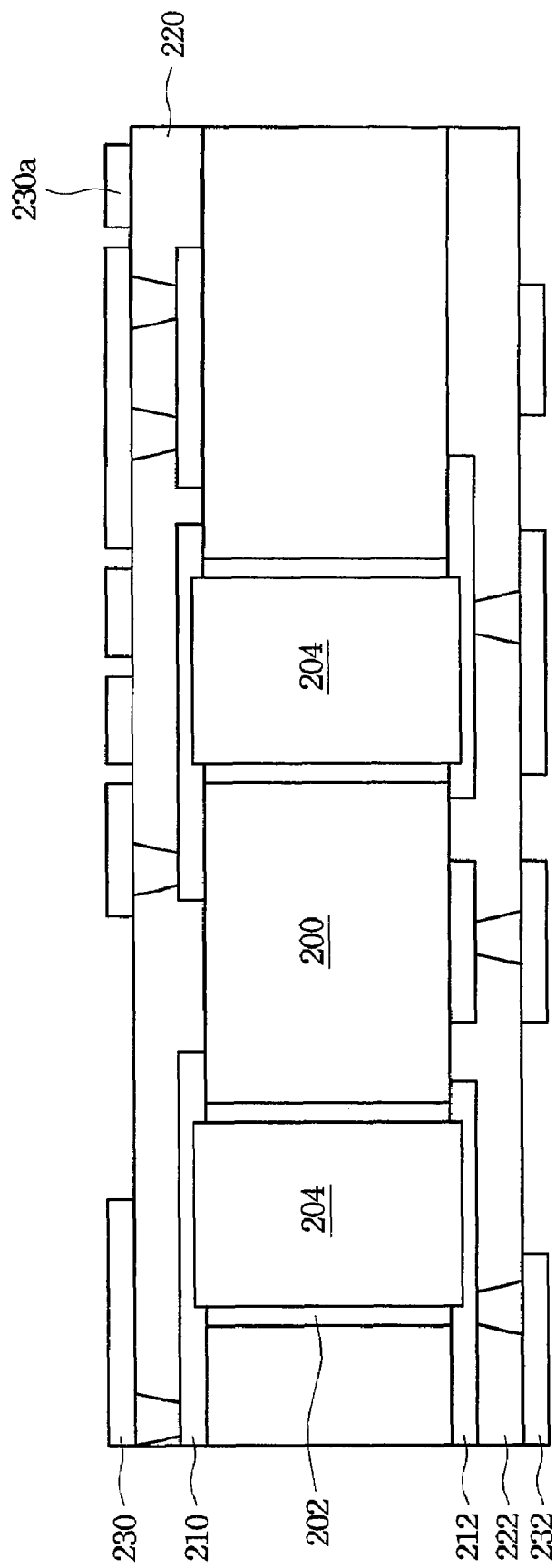
Figure 2E:
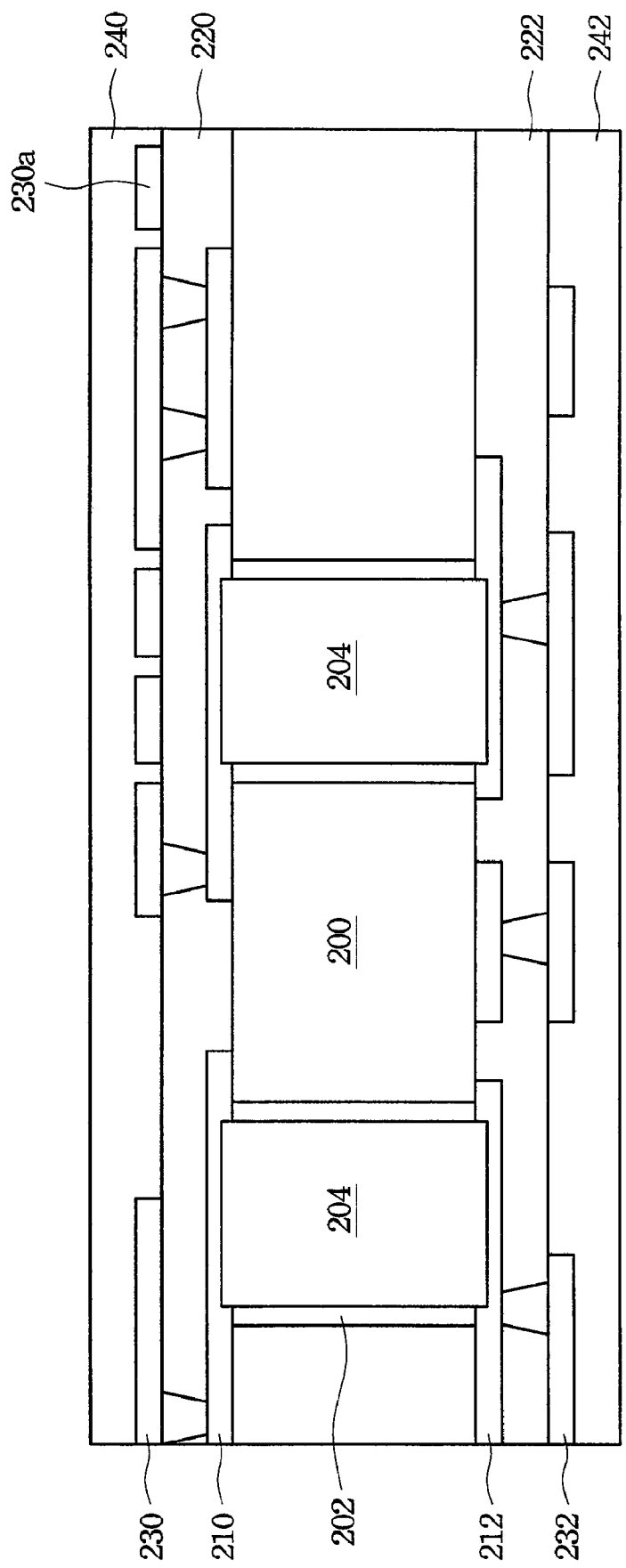
Figure 2F:
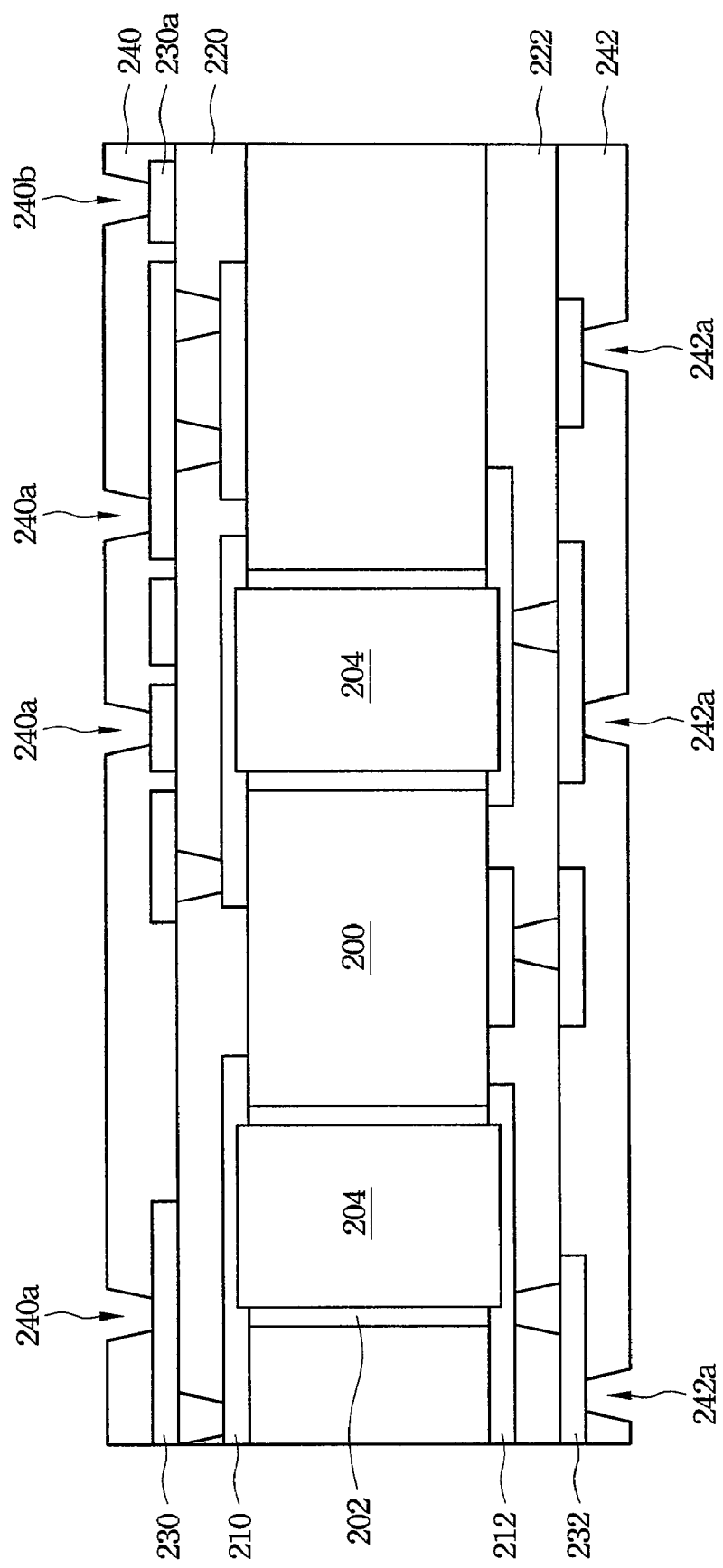
Figure 2G:
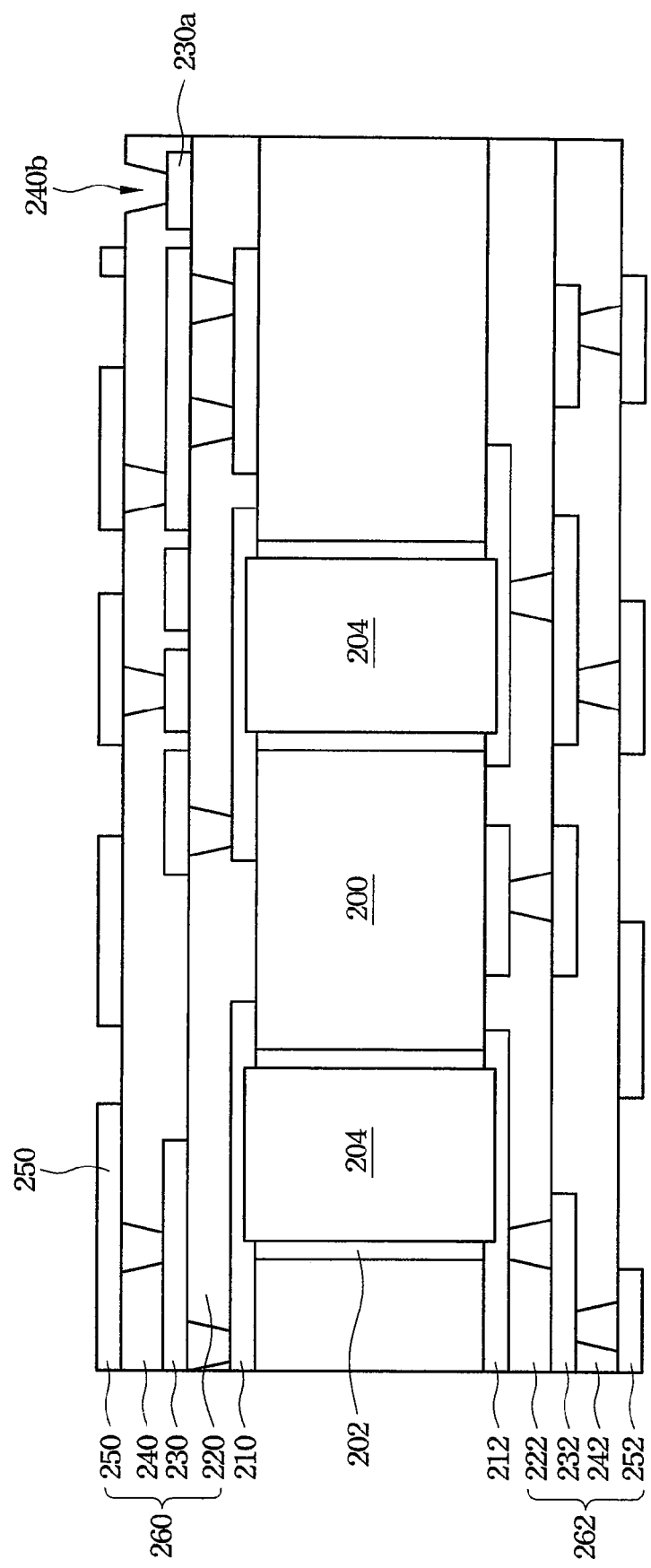
Figure 2H:
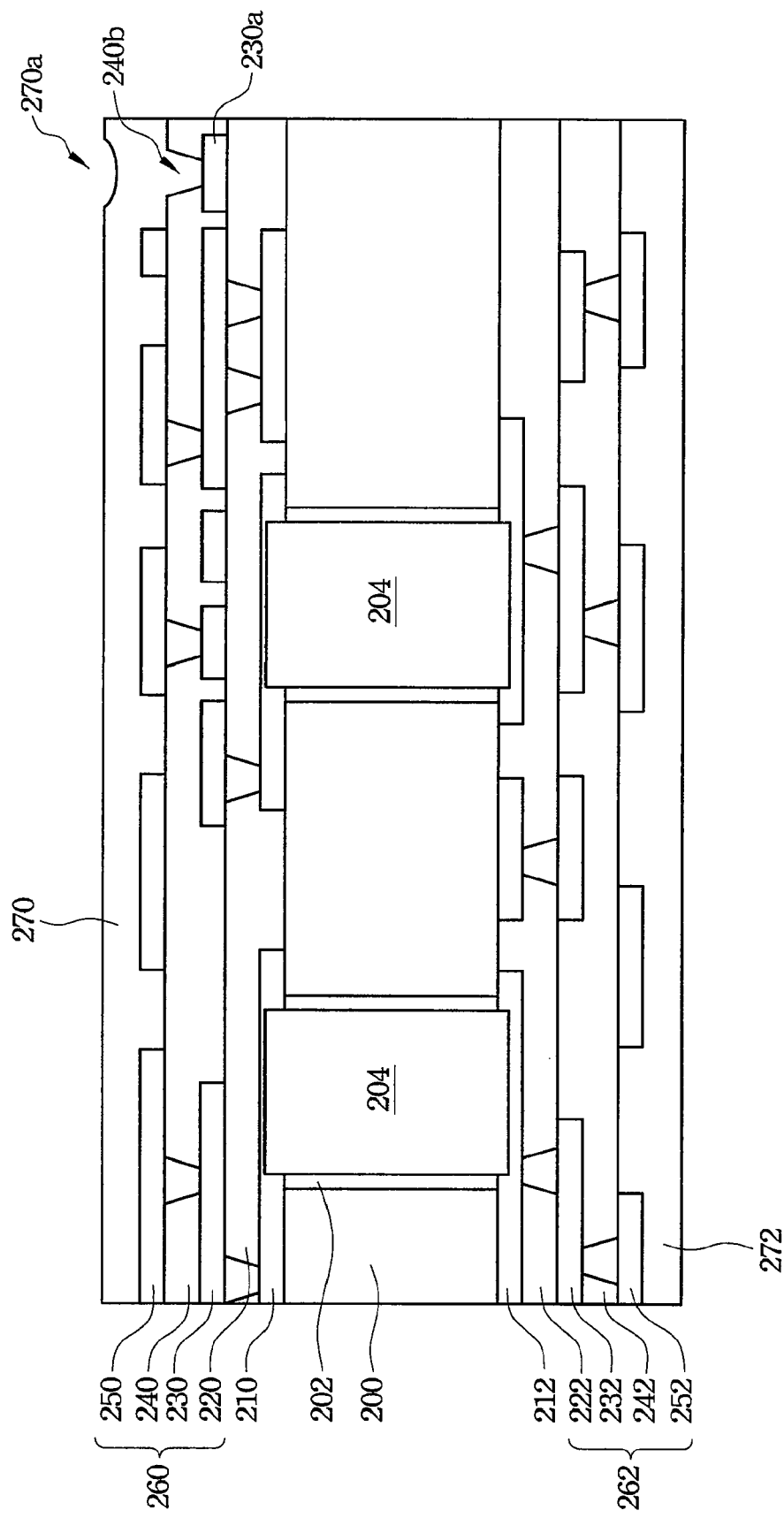
Figure 2I:
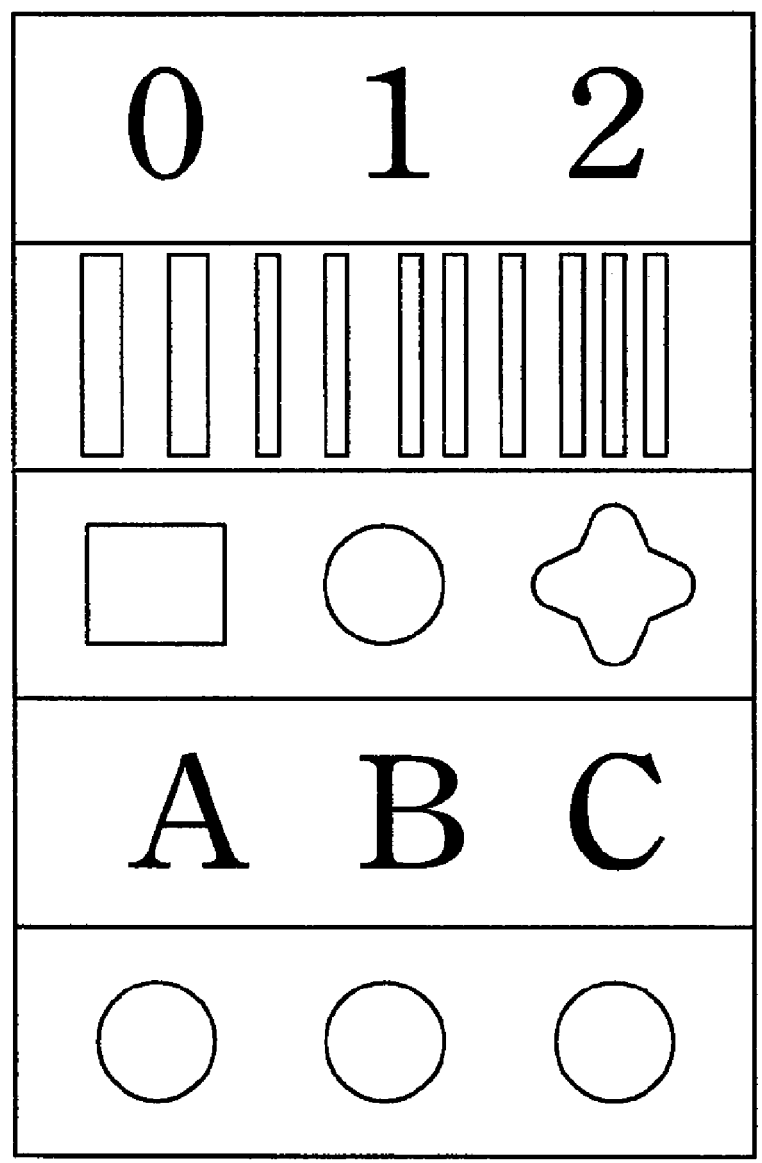

Reference is made to FIGS. 2A to 2I, which depict cross-sectional diagrams of the process flow of a substrate structure according to one preferred embodiment of the present invention. As shown in FIG. 2A, a core substrate 200 is provided, which includes a top surface 200a and a bottom surface 200b opposite the top surface 200a. The top surface 200a and the bottom surface 200b have circuit patterns 210 and 212 thereon, respectively. The core substrate 200 has at least one through hole (not shown) therethrough. A conductive layer 202 is disposed in the through hole for electrically connecting to the circuit patterns 210 and 212, and an insulating material 204 blocks the through hole up. Next, inner dielectric layers 220 and 222 are formed on the top surface 200a and the bottom surface 200b, respectively, so as to cover the circuit patterns 210 and 212, as shown in FIG. 2B. In this embodiment, the inner dielectric layers 220 and 222 may comprise ABF (Ajinomoto Buildup Film) and be formed by lamination type. However, the inner dielectric layers 220 and 222 may comprise other dielectric materials or be formed by other types but not limited to the above description. Moreover, a plurality of vias 220a and 222a are formed on the inner dielectric layers 220 and 222, respectively, for example, by laser drilling procedure, so as to expose parts of the circuit patterns 210 and 212, as shown in FIG. 2C. Furthermore, inner circuit layers 230 and 232 are formed on the inner dielectric layers 220 and 222, respectively, and fill the vias 220a and 222a, respectively, as shown in FIG. 2D, so as to electrically connect to the circuit patterns 210 and 212, respectively. In this embodiment, the inner circuit layers 230 and 232 may formed by the steps of coating conductive material, coating photoresist material and photolithography etc. Next, surface dielectric layers 240 and 242 are formed on the inner circuit layers 230 and 232, respectively, as shown in FIG. 2E. In this embodiment, the surface dielectric layers 240 and 242 may comprise ABF and be formed by lamination type. However, the surface dielectric layers 240 and 242 may comprise other dielectric materials or be formed by other types but not limited to the above description. And then, a plurality of vias 240a, 240b and 242a are formed on the surface dielectric layers 240 and 242, respectively, by laser drilling procedure, as shown in FIG. 2F. The via 240b is not utilized in electrical connection with upper and lower circuit layers, but in formation of an identification mark for the substrate. Next, surface circuit layers 250 and 252 are formed on the surface dielectric layers 240 and 242, respectively, and fill the vias 240a and 242a, as shown in FIG. 2G. However, the via 240b is not utilized in electrical connection with upper and lower circuit layers, so it is not covered with the surface circuit layer 250. In this embodiment, the via 240b is used for passing through the dielectric layer 240 and exposing a part of the inner circuit layer 230a, but it is not limited to the above description. For example, the via 240b may be a blind hole without exposing the inner circuit layer 230a. Alternatively, the inner circuit layer 230a below the via 240b may be a protective layer that is additionally formed and has no circuit connection for preventing over-drilling when the via 240b is being formed by laser drilling procedure. It is worth mentioning that the inner dielectric layers 220 and 222, the inner circuit layers 230 and 232, the surface dielectric layers 240 and 242, and the surface circuit layers 250 and 252 may be interconnection portions 260 and 262 (shown in FIG. 2I) formed by the conventional build-up processes or lamination processes. However, the present invention does not limit the circuit and dielectric layers in the interconnection portions 260 and 262 to a certain quantity as long as at least one hole is formed on the most outside dielectric layer for being an identification mark of the substrate. Moreover, solder masks 270 and 272 are formed on the surface circuit layers 250 and 252, respectively, as shown in FIG. 2H, so as to protect the surface circuit layers 250 and 252. Since the surface dielectric layer 270 has the via 240b thereon that is not covered with the surface circuit layer 250, the solder mask 270 will form an indentation 270a on the via 240b. It can be comprehended that the shape of the indentation 380a depends on the one of the via 340b formed previously. In this embodiment, the shape of the indentation 380a may be, for example, numeral-, character-, or drawing-shaped, as shown in FIG. 2I, for identifying the substrate.

Figure 3A:
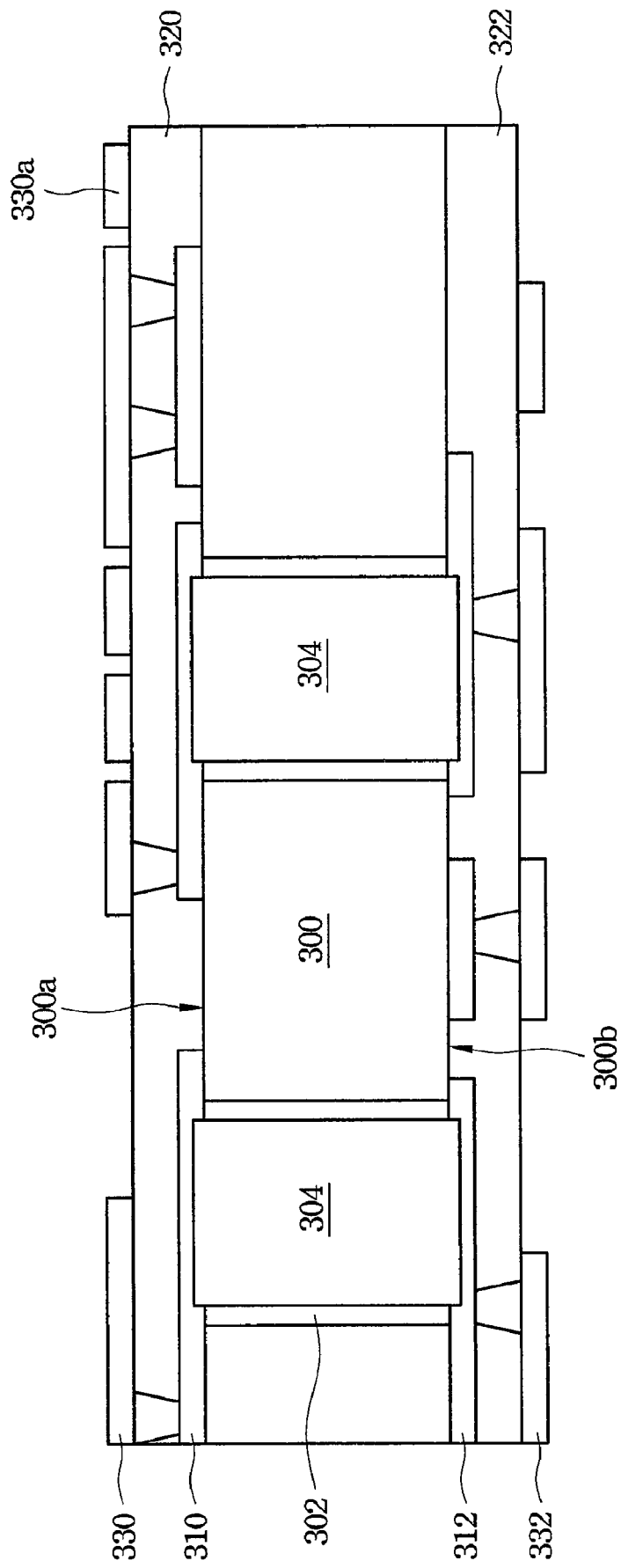
FIGS. 3A to 3J are cross-sectional diagrams of the process flow of a substrate structure according to another embodiment of the present invention.
Figure 3B:
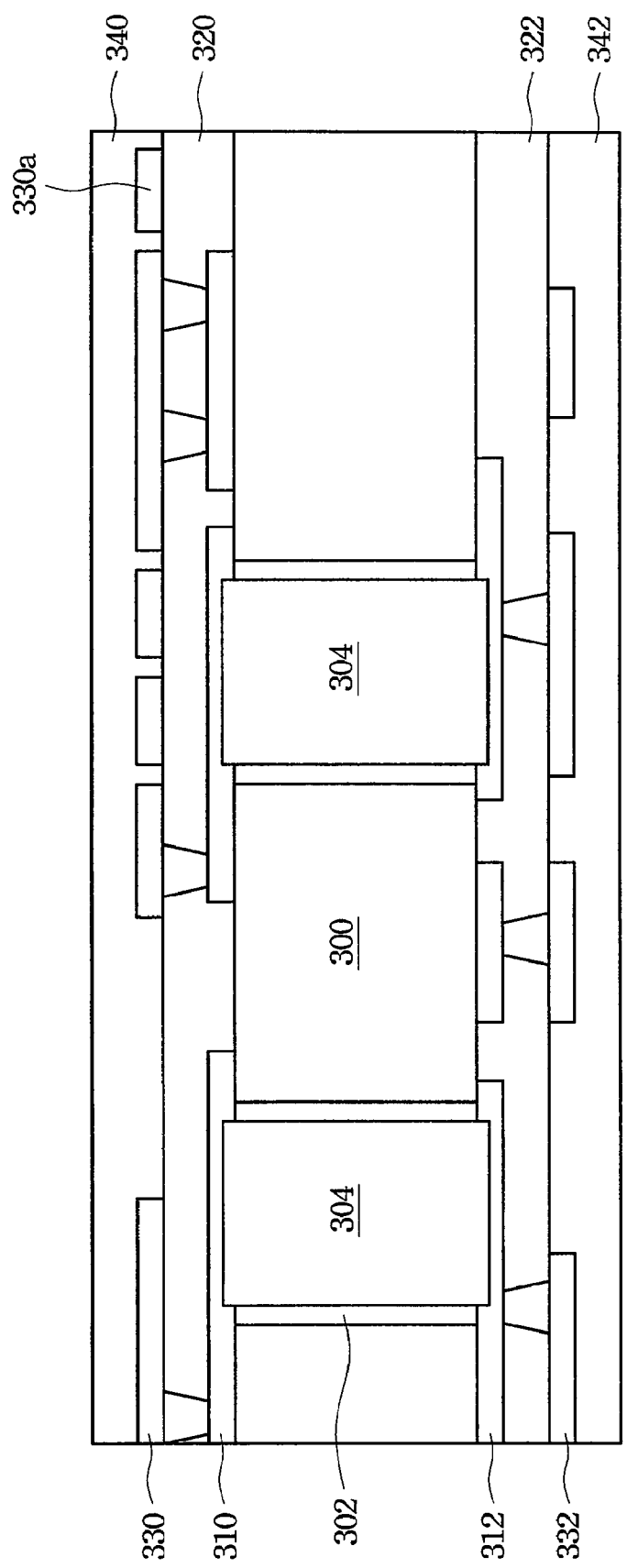
Figure 3C:
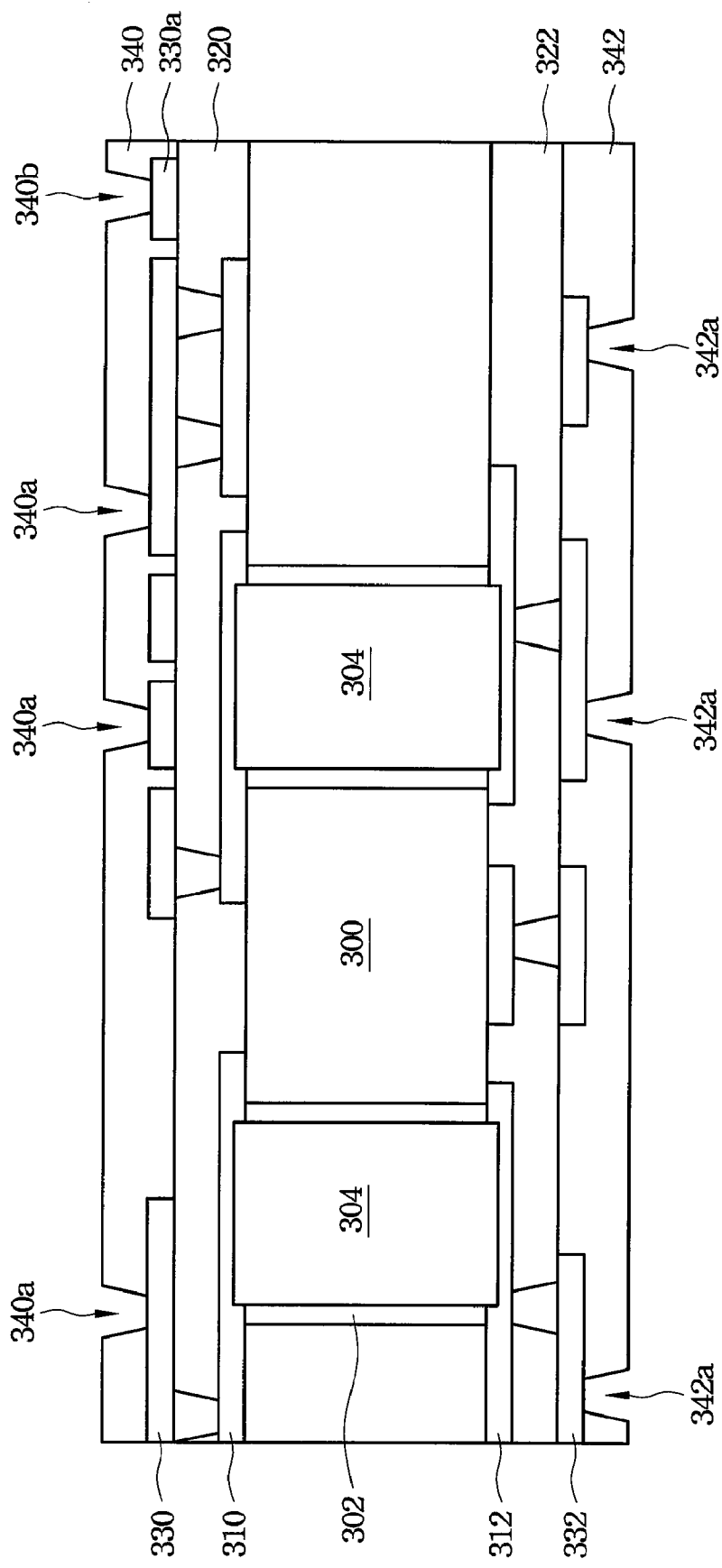
Figure 3D:
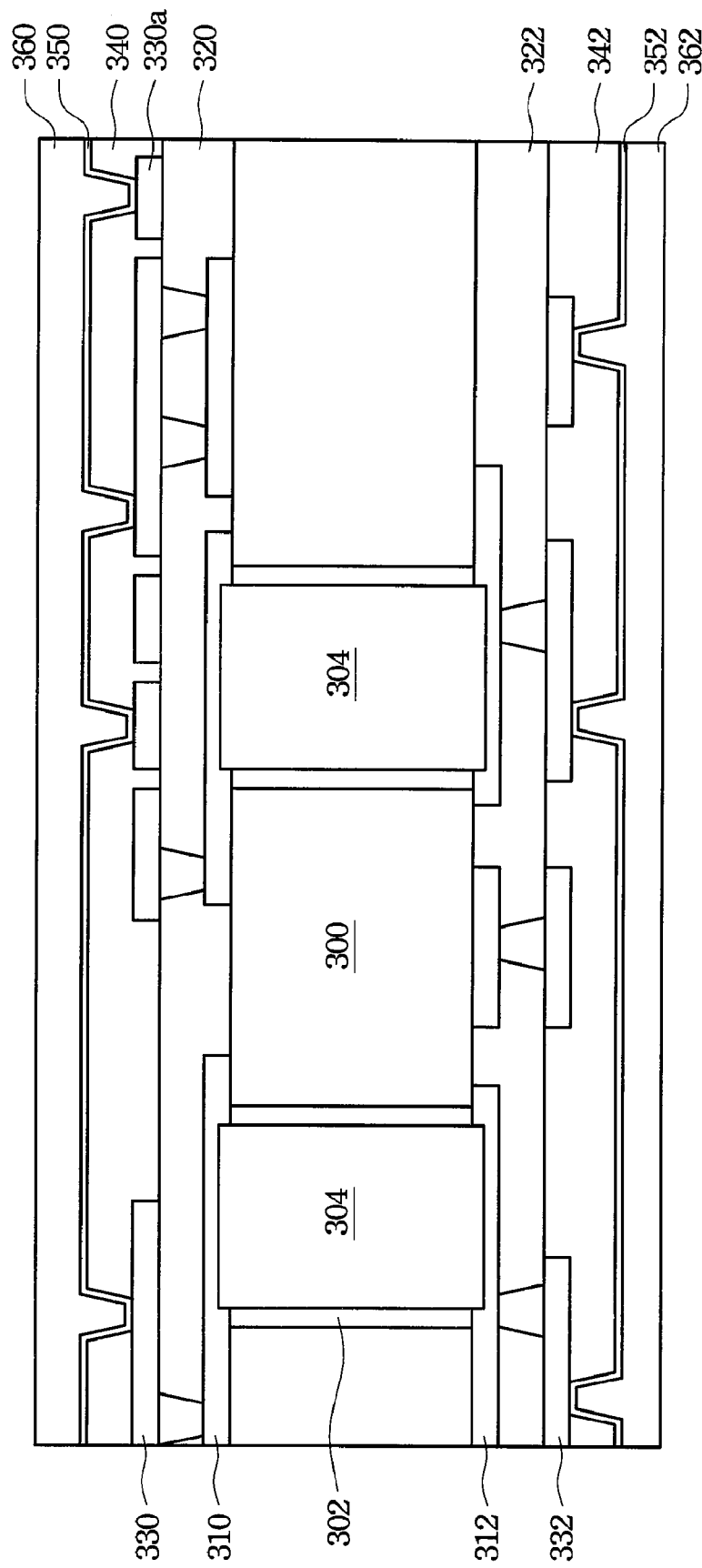
Figure 3E:
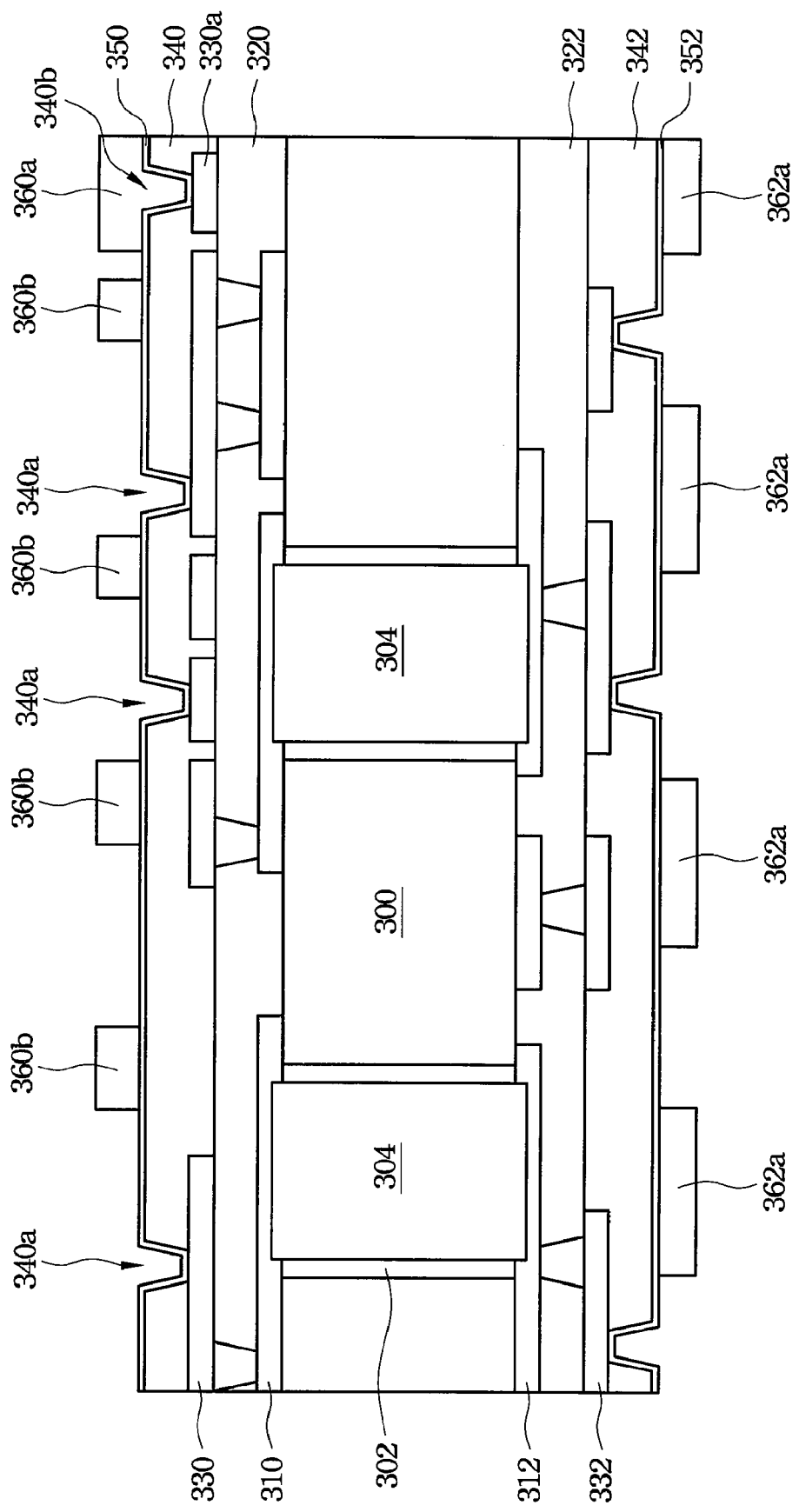
Figure 3F:
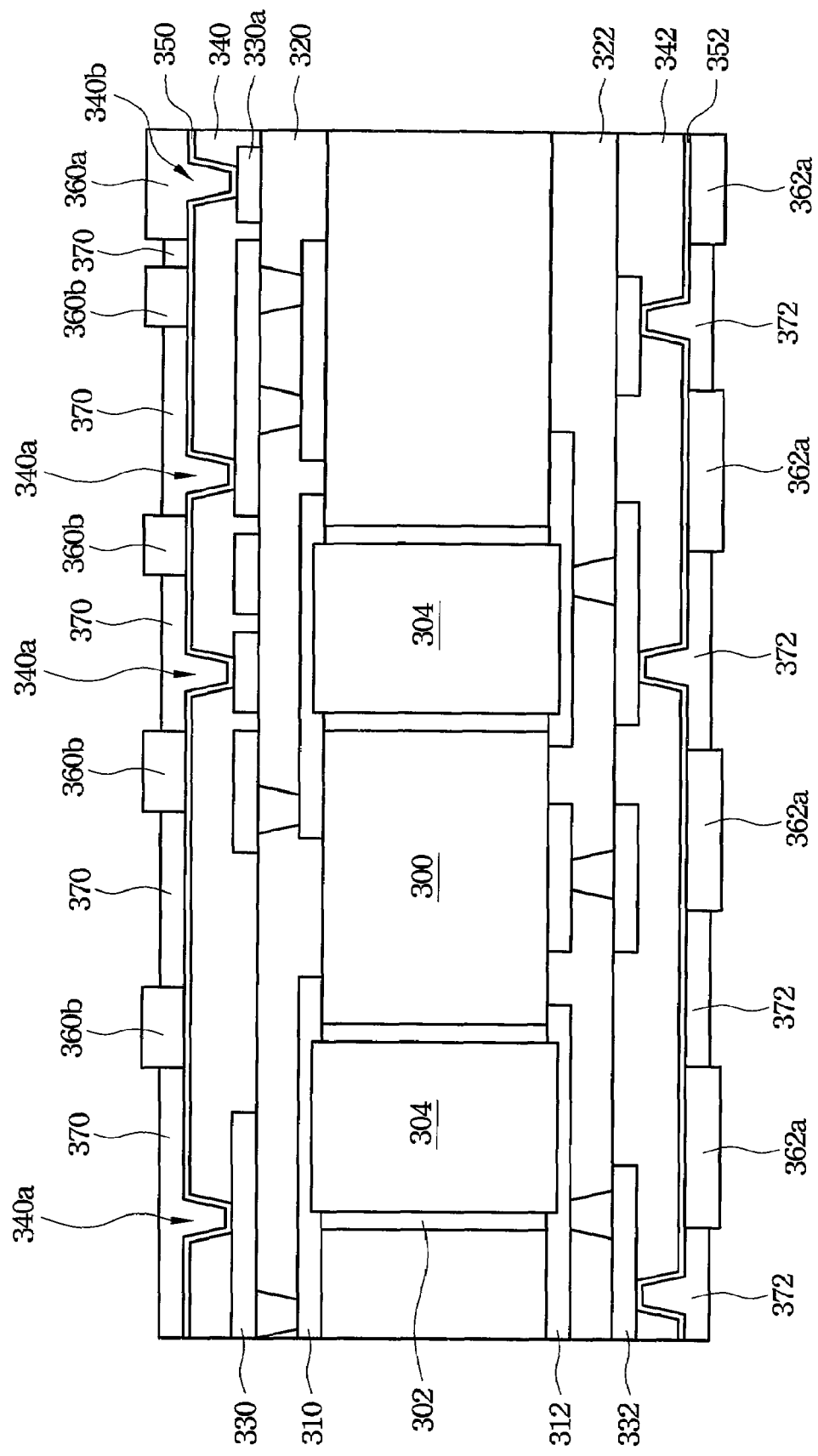
Figure 3G:
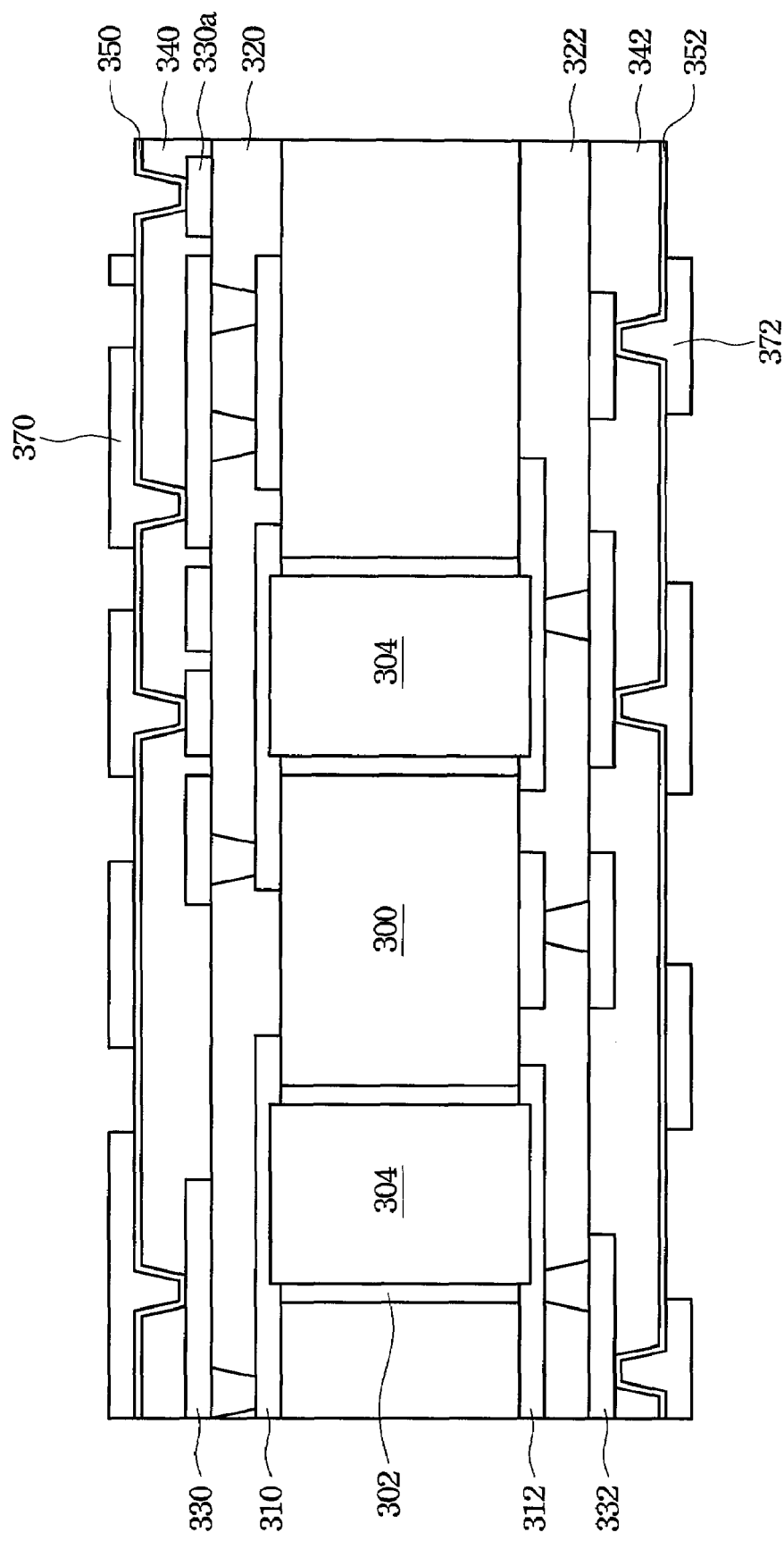
Figure 3H:
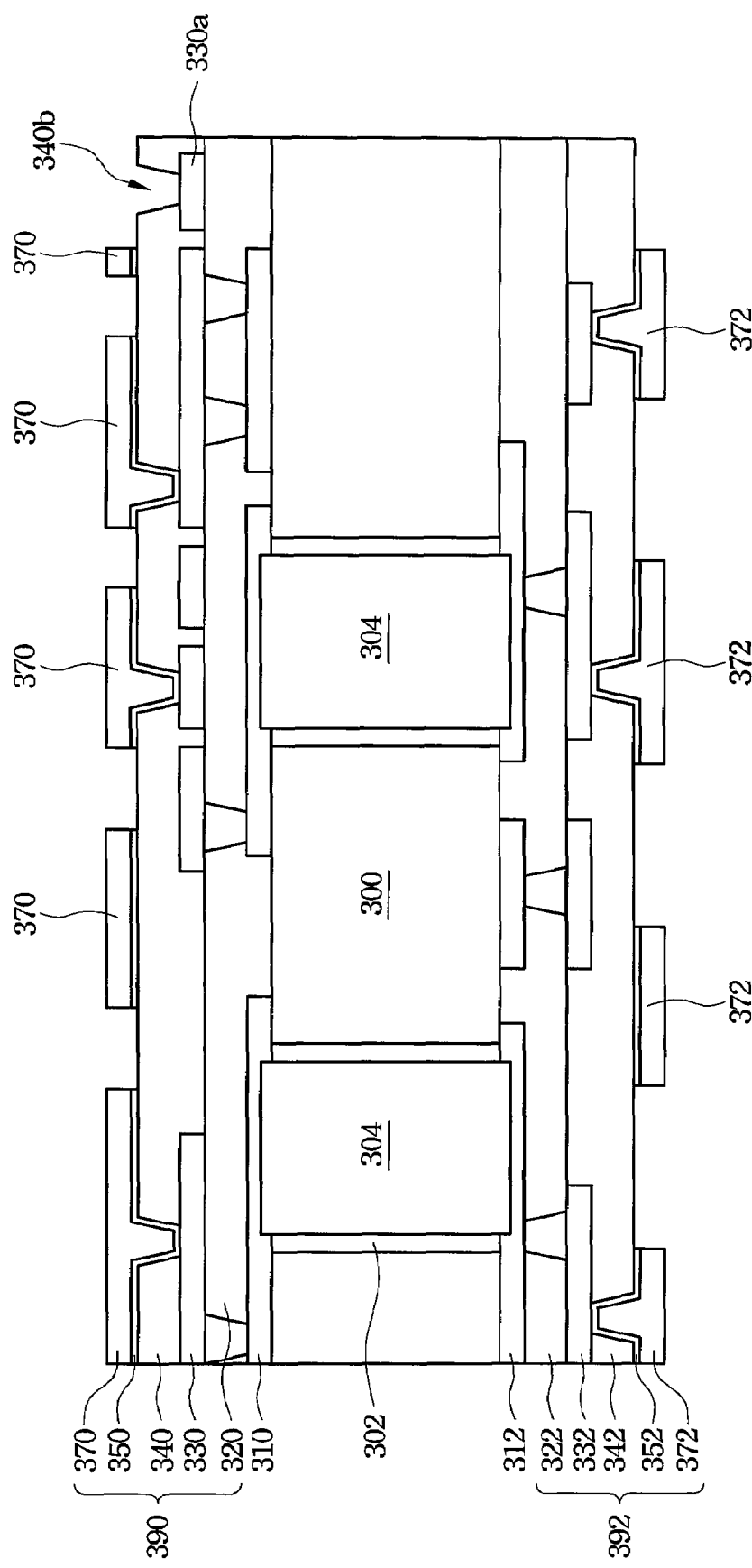
Figure 3I:
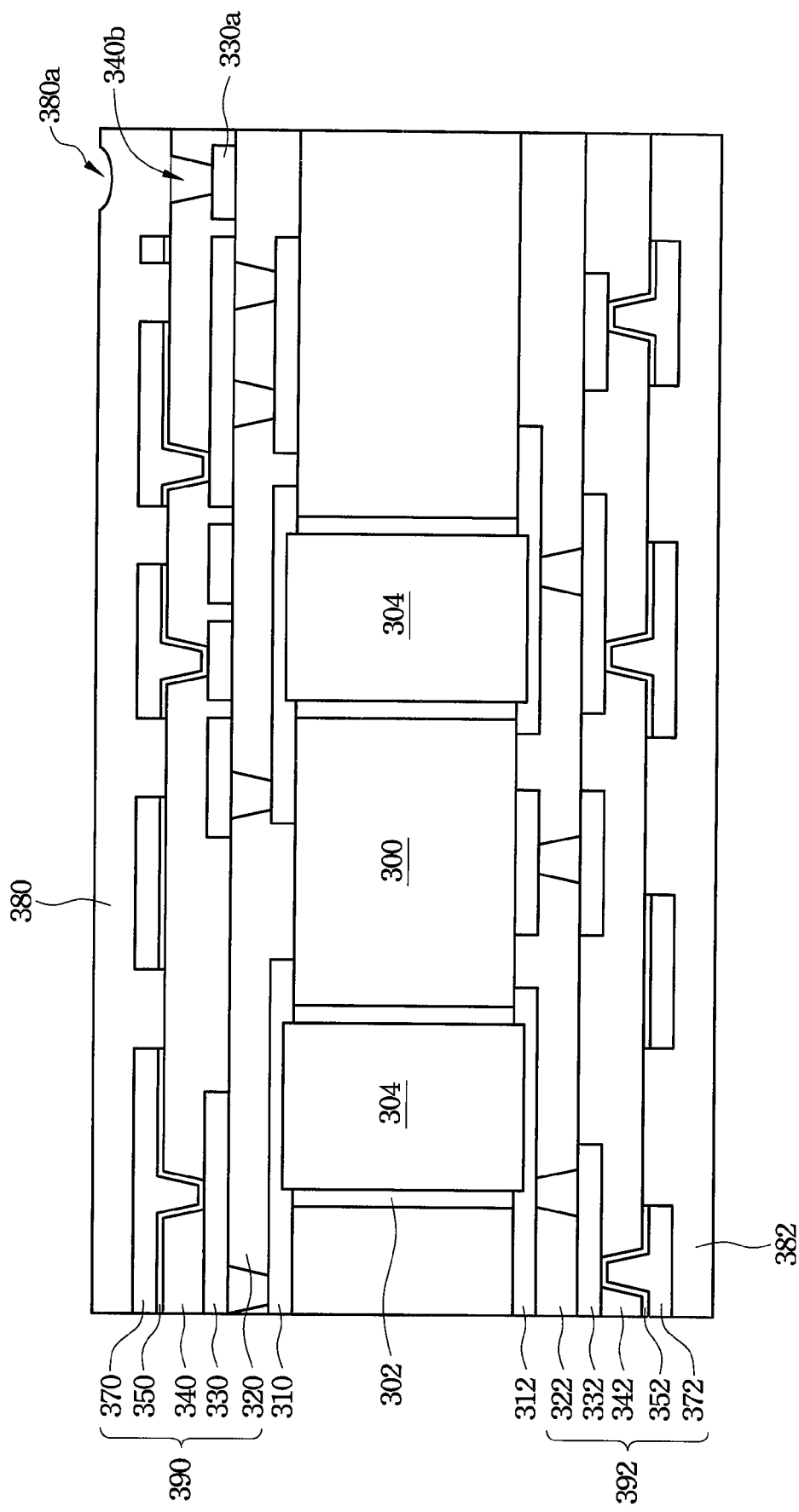
Figure 3J:
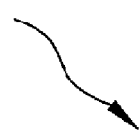
Figure 3J:
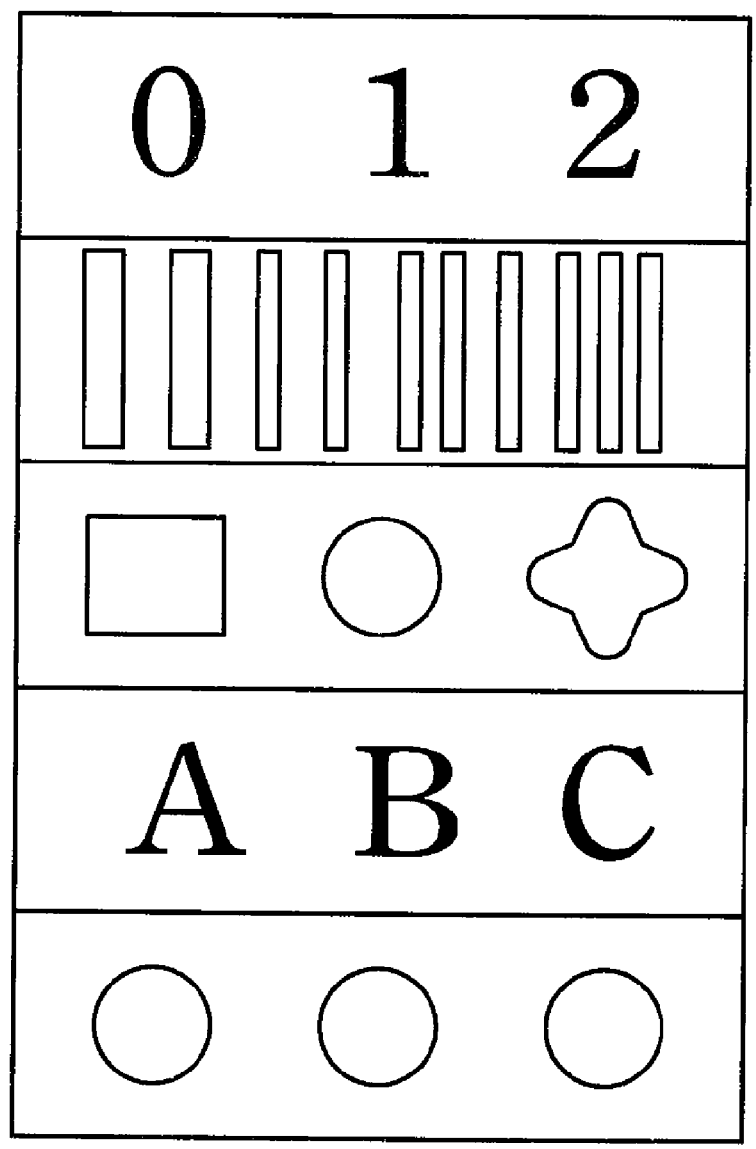

Reference is made to FIGS. 3A to 3J, which depict cross-sectional diagrams of the process flow of a substrate structure according to another embodiment of the present invention. As shown in FIG. 3A, a core substrate 300 is provided, which includes a top surface 300a and a bottom surface 300b opposite the top surface 300a. The top surface 300a and the bottom surface 300b have circuit patterns 310 and 312 thereon, respectively. The core substrate 300 has at least one through hole (not shown) therethrough. A conductive layer 302 is disposed in the through hole for electrically connecting to the circuit patterns 310 and 312, and an insulating material 304 blocks the through hole up. Next, inner dielectric layers 320 and 322 are formed on the top surface 300a and the bottom surface 300b, respectively, so as to cover the circuit patterns 310 and 312. Moreover, a plurality of vias (not shown) are formed on the inner dielectric layers 320 and 322, respectively, for example, by laser drilling procedure, so as to expose parts of the circuit patterns 310 and 312. Furthermore, inner circuit layers 330 and 332 are formed on the inner dielectric layers 320 and 322, respectively, and fill the vias respectively, so as to electrically connect to the circuit patterns 310 and 312, respectively. Next, surface dielectric layers 340 and 342 are formed on the inner circuit layers 330 and 332, as shown in FIG. 3B. And then, a plurality of vias 340a, 340b and 342a are formed on the surface dielectric layers 340 and 342, respectively, by laser drilling procedure, as shown in FIG. 3C. The via 340b is not utilized in electrical connection with upper and lower circuit layers, but in formation of an identification mark for the substrate. Moreover, seed layers 350 and 352 are formed on the surface dielectric layers 340 and 342, respectively, by electroless plating procedure, as shown in FIG. 3D. Furthermore, photoresist layers 360 and 362 are formed on the seed layers 350 and 352, respectively. In this embodiment, the photoresist layers 360 and 362 are formed by laminating dry films. After exposing and developing, photoresist pattern layers 360a, 360b and 362a are defined, wherein the photoresist pattern layer 360a is disposed over the via 340. And then, surface circuit layers 370 and 372 are formed on the seed layers 350 and 352 by plating, and fill the vias 340a and 342a, as shown in FIG. 3F, wherein the via 340b has no surface circuit layer 370 thereon due to coverage with the photoresist pattern layer 360a. It is worth mentioning that the thickness of the surface circuit layer 370 or 372 is no more than the one of the photoresist pattern layer 360a, 360b or 362a. Afterward, the photoresist pattern layers 360a, 360b and 362a are removed to expose the via 340b, as shown in FIG. 3G. Moreover, a micro-etching is performed to remove the seed layers 350 and 352 that are not covered with the surface circuit layers 370 and 372, as shown in FIG. 3H. In this embodiment, the via 340b passes through the surface dielectric layer 340 to expose a part of the inner circuit layer 330a, but it is not limited to the above description. The via 340b may be a blind hole without exposing the inner circuit layer 330a. Alternatively, the inner circuit layer below the via 340b may also be a protective layer that is additionally formed and has no circuit connection for preventing overdrilling when the via 340b is being formed by laser drilling procedure. It is further worth mentioning that the inner dielectric layers 320 and 322, the inner circuit layers 330 and 332, the surface dielectric layers 340 and 342, the seed layers 350 and 352, and the surface circuit layers 370 and 372 may be interconnection portions 390 and 392. However, the present invention does not limit the circuit and dielectric layers in the interconnection portions 390 and 392 to a certain quantity as long as at least one hole is formed on the most outside dielectric layer for being an identification mark of the substrate. Moreover, solder masks 380 and 382 are formed on the surface circuit layers 370 and 372, respectively, as shown in FIG. 3I, so as to protect the surface circuit layers 370 and 372. Since the surface dielectric layer 340 has the via 340b thereon that is not covered with the surface circuit layer 370, the solder mask 380 will form an indentation 380a on the via 340b. It can be comprehended that the shape of the indentation 380a depends on the one of the via 340b formed previously. In this embodiment, the shape of the indentation 380a may be, for example, numeral-, character-, or drawing-shaped, as shown in FIG. 3J, for identifying the substrate.

In brief, the substrate strip of the present invention is characterized by the identification mark directly fabricated on the substrate unit, for ensuring that the lot number of the substrate unit in the packaging structure can be still identified while the packaging process is completed, so as to overcome the prior problems of more difficulties in monitoring process and trouble shooting in the package structure, as well as the problem of the decreased yield. Therefore, in comparison with the prior substrate structure, the one of the present invention can be effectively monitored and identified in any stage of the packaging process, so as to substantially raise the quality of the product and to reduce the process defective rate.

According to the aforementioned preferred embodiments, one advantage of the substrate structure and the method for manufacturing the same is to manufacture an substrate structure having an identification mark fabricated thereon, in which the identification mark is at least one hole designed to be formed on the surface dielectric layer but not covered with the surface circuit layer, for forming an indentation on the solder mask of the substrate structure as an identification mark for identifying the substrate unit, by using the prior process equipments instead of changing the existing prior process flow of the substrate structure. Therefore, in comparison with the conventional method for manufacturing the substrate structure, the method disclosed by the present invention, which is almost the same with the prior method for manufacturing the same, instead of changing the existing prior process flow, can manufacture the substrate structure having the identification mark, thereby increasing the product quality and process yield.

As is understood by a person skilled in the art, the foregoing preferred embodiments of the present invention are illustrated of the present invention rather than limiting of the present invention. It is intended to cover various modifications and similar arrangements included within the spirit and scope of the appended claims. Therefore, the scope of which should be accorded the broadest interpretation so as to encompass all such modifications and similar structure.

What is claimed is:

1. A substrate structure comprising:
 a core substrate comprising a top surface and a bottom surface opposite the top surface, wherein a first circuit pattern is disposed on the top surface;
 a first interconnection portion disposed on the top surface, wherein the first interconnection portion comprises a first surface dielectric layer and a first surface circuit layer disposed thereon, the first surface circuit layer is electrically connected to the first circuit pattern, the first surface dielectric layer has at least one hole thereon that is not covered with the first surface circuit layer, and the hole is an identification mark for the substrate but not utilized in forming an electrical connection with the first surface circuit layer and the first circuit pattern; and
 a first solder mask disposed on the first interconnection portion, wherein the first solder mask has an indentation above the hole, wherein a second solder mask is disposed on the second interconnection.

2. The substrate structure according to claim 1, wherein the first interconnection portion further comprises:
 a first inner circuit layer disposed below the first surface dielectric layer, wherein a part of the first inner circuit layer is below the hole and electrically connected to the first circuit pattern; and
 a first inner dielectric layer disposed below the first inner circuit layer.

3. The substrate structure according to claim 1, wherein the first interconnection portion further comprises:
 a first inner circuit layer and a protective layer disposed below the first surface dielectric layer, wherein the protective layer is below the hole, and the first inner circuit layer is electrically connected to the first circuit pattern; and
 a first inner dielectric layer disposed below the first inner circuit layer and the protective layer.

4. The substrate structure according to claim 1, further comprising a protective layer disposed below the hole.

5. The substrate structure according to claim 4, wherein the protective layer is a part of the first circuit pattern.

6. The substrate structure according to claim 1, wherein the hole is numeral-shaped.

7. The substrate structure according to claim 1, wherein the hole is character-shaped.

8. The substrate structure according to claim 1, wherein the hole is drawing-shaped for identifying the substrate structure.

9. The substrate structure according to claim 1, wherein the hole passes through the first surface dielectric layer to form a via.

10. The substrate structure according to claim 9, further comprising a protective layer disposed below the via.

11. The substrate structure according to claim 10, wherein the protective layer is a part of the first circuit pattern.

12. The substrate structure according to claim 9, wherein the first interconnection portion further comprises:
   a first inner circuit layer disposed below the first surface dielectric layer, wherein a part of the first inner circuit layer is below the via and electrically connected to the first circuit pattern; and
   a first inner dielectric layer disposed below the first inner circuit layer.

13. The substrate structure according to claim 9, wherein the first interconnection portion further comprises:
   a first inner circuit layer and a protective layer disposed below the first surface dielectric layer, wherein the protective layer is below the via, and the first inner circuit layer is electrically connected to the first circuit pattern; and
   a first inner dielectric layer disposed below the first inner circuit layer and the protective layer.

14. The substrate structure according to claim 1, wherein the bottom surface has a second circuit pattern thereon to electrically connected to the first circuit pattern through a through hole in the core substrate.

15. The substrate structure according to claim 14, further comprising:
   a second interconnection portion disposed on the bottom surface, wherein the second interconnection portion comprises a second surface dielectric layer and a second surface circuit layer disposed thereon, and the second surface circuit layer is electrically connected to the second circuit pattern; and
   a second solder mask disposed on the second interconnection portion, wherein the second solder mask covers the second surface circuit layer and the second surface dielectric layer.

* * * * *